Figure 1:
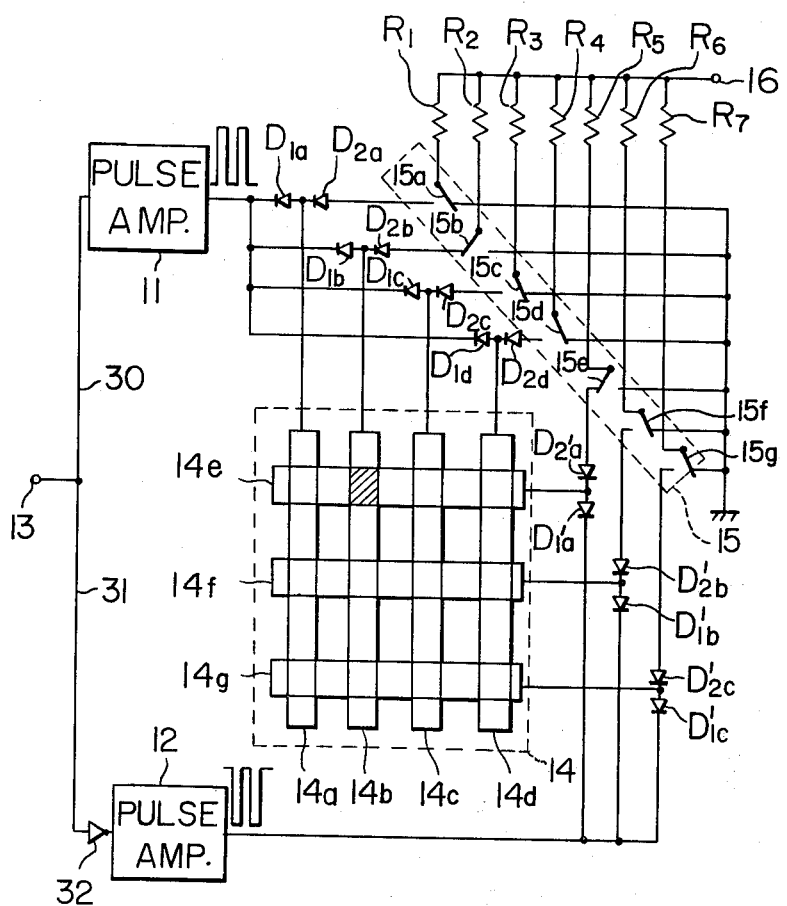

United States Patent [19]
Inami et al.

[11] 3,971,961
[45] July 27, 1976

[54] PULSE AMPLIFIER

[75] Inventors: Mamoru Inami; Yoshiaki Tanaka; Tsuyoshi Ono, all of Yokohama, Japan

[73] Assignee: Victor Company of Japan, Limited, Yokohama, Japan

[22] Filed: Dec. 26, 1974

[21] Appl. No.: 536,653

[30] Foreign Application Priority Data
Dec. 28, 1973 Japan..............................49-2750
Feb. 15, 1974 Japan..........................49-18162

[52] U.S. Cl.................................. 307/268; 330/20; 307/315
[51] Int. Cl.² ...................... H03K 3/26; H03K 5/08; H03K 19/36
[58] Field of Search ................ 330/20; 307/64, 315, 307/268

[56] References Cited
UNITED STATES PATENTS

| | | | |
|---|---|---|---|
| 3,192,399 | 6/1965 | Ih | 307/315 X |
| 3,243,510 | 3/1966 | Winston | 307/264 X |
| 3,332,028 | 7/1967 | Kayser et al. | 307/315 X |
| 3,436,563 | 4/1969 | Regitz | 307/315 X |
| 3,582,688 | 6/1971 | Hilbert | 307/315 X |
| 3,648,060 | 3/1972 | Hagen | 307/254 X |
| 3,862,432 | 1/1975 | Larson | 307/315 X |

*Primary Examiner*—Robert Segal
*Attorney, Agent, or Firm*—Depaoli & O'Brien

[57] ABSTRACT

A pulse amplifier has a first grounded emitter transistor arranged to receive input pulses to change its on-off states in accordance with the presence and absence of the applied pulses and a pair of second and third transistors having their collectors connected in common to a power supply. The second transistor has its base connected to the collector of the first transistor and its emitter connected to the base of the third transistor. The third transistor has its emitter connected to an output terminal from which a high voltage heavy current pulse is obtained so that the pair of transistors change their on-off states alternately with the first transistor. A semiconductor circuit is connected across the emitter and base of the second transistor to instantly put the base potential of the third transistor to a level equal to the base potential of the second transistor when the second transistor changes its state from conducting to nonconducting to thereby assure short decay time at the trailing edge of the output pulse.

11 Claims, 8 Drawing Figures

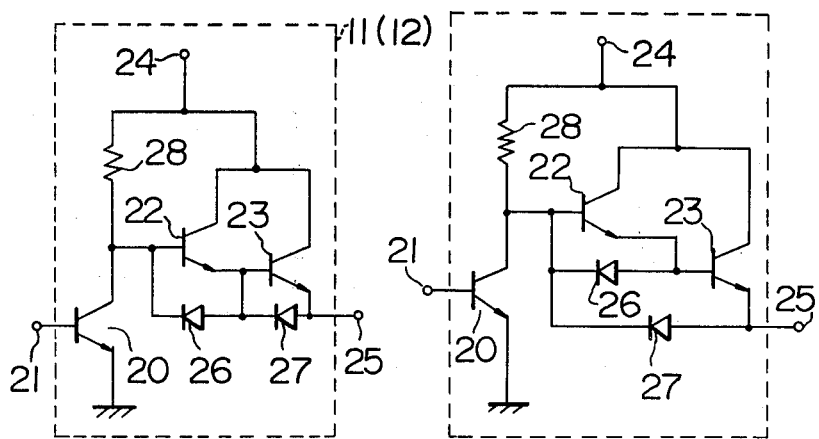
Fig. 2
Fig. 3
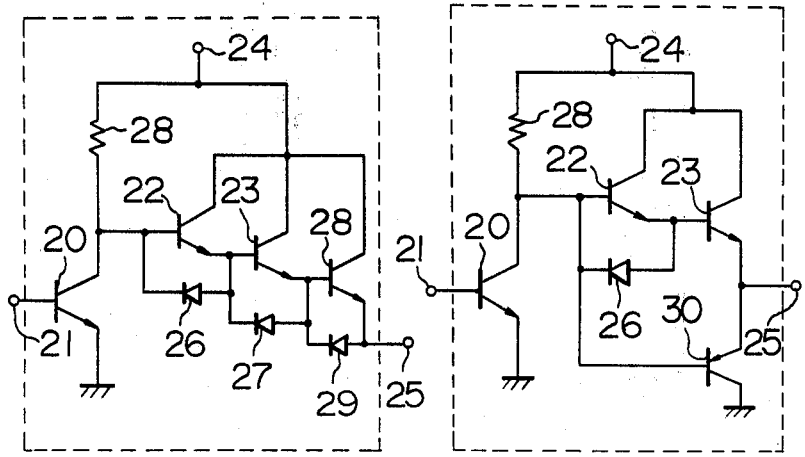
Fig. 4
Fig. 5

PULSE AMPLIFIER

The present invention relates generally to a plasma display device and more particularly to a pulse amplifier which supplies high voltage heavy current pulses to produce a glow discharge across a pair of opposite electrodes disposed within a gas-filled tube, of the display device.

A conventional plasma display device employs a pair of pulse drive or pulse amplifier circuits which supply high voltage heavy current pulses in alternate periods to a pair of electrode disposed within a gas-filled tube or chamber. A conventional pulse amplifier provides on-off switching in accordance with the presence and absence of applied input pulses and produces high voltage heavy current pulses. However, such high voltage heavy current pulses have a long decay time at the trailing edge of the pulse to the extent that such a pulse cannot be used as a drive pulse for the plasma display panel.

The object of the invention is to provide an improved pulse amplifier which supplies high voltage heavy current, sharp pulses.

In accordance with the invention there is provided a pulse amplifier employed in a plasma display device. The plasma display device comprises a pulse generator which supplies first and second trains of pulses occurring in alternate periods, a bias voltage source, a switching means for selectively providing a path for said bias voltage source, a gas-filled discharge tube or chamber in which at least a pair of electrodes is disposed, a plurality of diode pairs consisting of a first charge storage type diode and second diode series connected thereto, each pair being connected to the switch means to receive current therefrom when the switch is selectively closed to store electricity, the junction point of the diode pair being connected to the electrodes. A pair of first and second pulse amplifiers is provided which receive input pulses from the pulse generator to produce a high voltage heavy current pulse in alternate fashion. Such a pulse is of a potential higher than the bias potential so that the charged electricity stored in the selected diode pair is discharged when backwardly applied with the high voltage pulse. The discharged current is delivered to one of the pair of electrodes to raise it to a high potential with respect to the other. The pulse amplifier comprises a first transistor which operates to the input pulses applied thereto and changes its on-off states, and a pair of transistors having their collectors connected in common to a power supply which is at a higher positive potential than the bias source. The on-off switching of the first transistor causes the transistor pair to change its state alternately with the first transistor to produce a high voltage heavy current pulse at the output terminal. The amplifier further includes a semiconductor passage connected to the output thereof for the bias current that charges the charge-storage type diode when the amplifier is inactive.

The invention will be further described in the following detailed description with reference to the accompanying drawings, in which:

FIG. 1 is a schematic circuit diagram of a plasma display device to which the invention is applicable; and FIGS. 2 to 8 are circuit diagrams of a pulse amplifier in accordance with the present invention.

Referring now to the drawings in which like numerals indicate like parts throughout the several views. In FIG. 1 there is shown a plasma display device 10 to which the present invention is applicable. The device 10 generally comprises first and second pulse amplifier circuits 11 and 12 of the same configuration connected to a pulse generating source 13, a plasma display panel 14 of a conventional construction shown schematically in dashed rectangle for the sake of simplicity since the invention is not concerned with the detail of the display panel, but which usually comprises a gas-filled discharge tube or chamber and a plurality of opposite electrodes arranged therein in a matrix or a desired configuration. The device 10 further comprises a set of series-connected diode pairs and a switching network in a dashed rectangle 15.

Each of the diode pairs comprises a first diode $D_1$ of a charge storage type having its cathode connected to the output of one of the pulse amplifiers 11 and 12 and a second diode $D_2$ having its anode connected to the respective contact of the switching network 15 which may comprise electromechanical relays or solid-state switching devices. In this exemplary embodiment, the switching network 15 is shown comprising a first set of relay contacts 15a to 15d and a second set of contacts 15e to 15g. These relay contacts are selectively operated by command signals to apply a positive potential of 5 volts from the bias voltage source 16 through one of the resistors $R_1$ to $R_7$ to a selected set of diode pairs. For example, if relay contacts 15b and 15e are operated as shown in FIG. 1, charges will be stored in diodes $D_{1b}$ and $D_{1a}'$, the bias current being allowed to flow therethrough to the respective pulse amplifiers, stored electricity will be discharged when one of the diodes $D_{1b}$ and $D_{1a}'$ is backwardly applied with a positive pulse of about 145 volts alternately supplied from the pulse amplifiers 11 and 12, and a glow discharge will occur at a point of coincidence on the corresponding electrodes, in this case, electrodes 14b and 14e.

In accordance with the invention, each of the pulse amplifier circuits 11 and 12 comprises, as shown in FIG. 2, a first switching transistor 20 having its base connected to an input terminal 21 and its emitter connected to ground (grounded emitter) and its collector connected to a power supply 24 through collector resistor 28. Second and third transistors 22 and 23 are provided having their collectors connected in common to the power supply 24 of positive potential of 145 volts. The second transistor 22 has its base connected to the collector of transistor 20 and its emitter connected to the base of the third transistor 23. Third transistor 23 has its emitter connected to an output terminal 25. Second transistor 22 has its emitter and base shunted in a forward direction by a diode 26. Diode 27 is connected across the emitter and base of third transistor 23 to allow bias current supplied from bias supply source 16 to flow into the amplifier through ouput terminal 25, diodes 27 and 26 and transistor 20, to ground.

When regularly occurring pulses are supplied from the pulse generating source 13 on leads 17 and 18, the pulses on lead 30 will cause the transistor 20 of amplifier 11 to change its on-off states in accordance with the presence and absence of the input pulses and the pulses on lead 31 have their polarities inverted by an inverter 32 so that transistor 20 of amplifier 12 will change its on-off states in alternate relationship with the transistor 20 of amplifier 11. Each of the transistors 20 of the amplifiers 11 and 12 is made conductive by the presence of a positive-going input pulse. This lowers the potential at the base of second transistor 22 with a resultant reduction in current flowing through the base to emitter of the third transistor 23. Transistors 22 and 23 are thus turned off and the potential at the output terminal 25 goes low. When the input level goes low, the first transistor 20 will be turned off, and second and third transistors 22 and 23 will be turned on to thereby apply the positive potential to the output terminal 25. It will be seen that the pulse amplifier of the invention is capable of supplying a high-voltage large current pulse. This positive pulse is alternately applied to the cathode side of first diodes $D_{1a}$ to $D_{1d}$ and to diodes $D_{1a}'$ to $D_{1c}'$. Assume that pulse amplifier 11 is made active and since the applied pulse is much higher in potential than the bias potential, the charged electricity in the diode $D_{1b}$ will be discharged through the junction point between the diodes $D_{1b}$ and $D_{2b}$. While the stored electricity is being discharged, the threshold level of the diode $D_{1b}$ is lowered and the pulse current is allowed to pass therethrough with the discharged current to electrode 14b. At this instant, the pulse amplifier 12 is made inactive, and the charging current from the bias source 16 will flow through contact 15e, diodes $D_{2a}'$ and $D_{1a}'$ to the diodes 27 and 26 and transistor 20 of the amplifier 12. Therefore, a high positive potential develops on the electrode 14b with respect to electrode 14e and a glow discharge will be produced at a point of coincidence on the electrodes 14b and 14e. In a subsequent period, the pulse amplifier 12 is made active and the amplifier 11 inactive and the electrode 14e becomes positive with respect to the electrode 14b and a glow discharge will occur on the same point of coincidence as occurred in the previous period. The glow will continue as long as the contacts remain operated.

Figure 6:
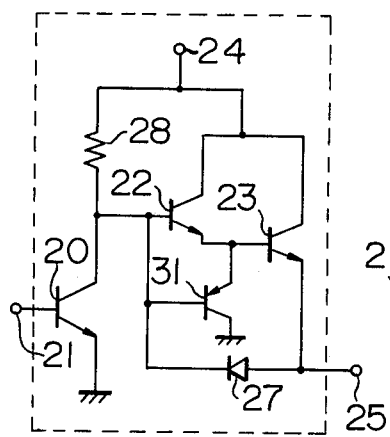

Diode 27 which serves as a passage for the current that charges the charge storage type diode may be connected across the emitter of third transistor 23 and the collector of the first transistor 20 as shown FIGS. 3 and 6. On the other hand, diode 26 which is connected across the emitter and base of second transistor 22 provides a forward circuit path to put the base of transistor 23 instantaneously to a level equal to the potential at the base of transistor 22 when the transistor 22 changes its state from conductive to nonconductive states. This permits the output pulse to fall to zero potential in a shorter decay time than if the base of third transistor 23 is floated with respect to the base of second transistor 22.

Various circuit configurations are possible. In FIG. 4, additional transistor 33 and diode 29 are provided. Transistor 33 in addition to transistors 22 and 23 increases the current output. Diodes 26 and 27 serve not only as a means to provide short decay time but also as a passage for the charging current together with diode 29.

Diode 27 may be advantageously replaced with a transistor 30 as shown in FIG. 5. In this arrangement, each of transistors 22 and 23 has a base of one conductivity type such as p-type between an emitter and a collector of the opposite conductivity type (n-type) to serve as an n-p-n type transistor while transistor 30 has a base of n-type conductivity type and an emitter and a collector of p-type conductivity type to serve as a p-n-p type transistor. Transistor 30 has its emitter connected to the output terminal 25 and its collector connected to ground and its base connected to the collector of first transistor 20. The current passing through the output terminal 25, transistor 30 to transistor 20 is reduced to a level which is inversely proportional to the current amplification factor of the transistor 30. The reduced current through transistor 20 will cause a less reduction in current amplification factor of the transistor 20 than with the diode 27, thus lowering the low level output of the transistor 23 to a minimum.

Figure 7:
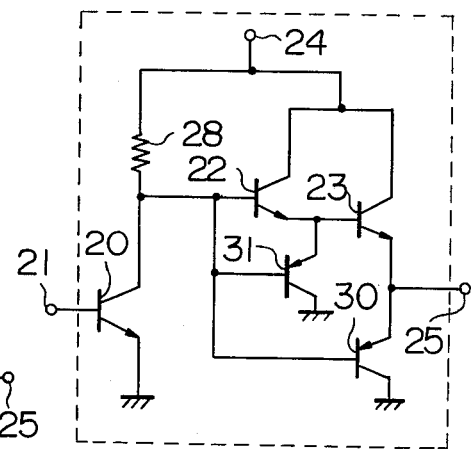
Figure 8:
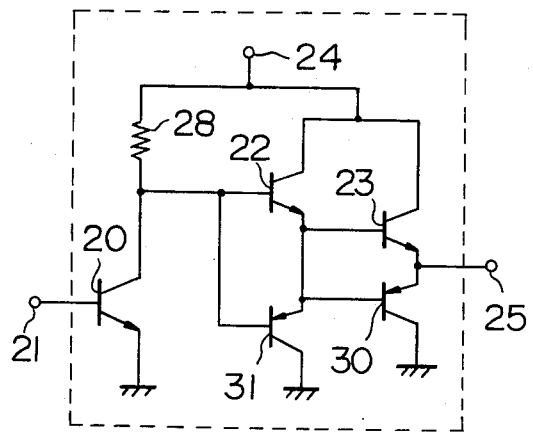

In an alternative arrangement, first diode 26 may be replaced with a transistor 31 as shown in FIG. 6 in which the transistor 31 has a base of one conductivity type opposite to the conductivity of the base of transistor 22 and connected so that the potential at the base of transistor 23 may be made instantaneously equal to the potential level of the base of transistor 22 when transistor 22 changes its state from conducting to nonconducting. FIG. 7 shows another alternative arrangement in which diodes 26 and 27 are both replaced with transistors 30 and 31. In FIG. 8, the transistor 30 has its base connected to the emitter of transistor 31.

The second and third transistors so connected to serve as an output switching function result in a great current amplification which is equal to that obtained by multiplying the current amplification factors of the respective transistors. This arrangment also permits these transistors to be operated in a saturation range and thus results in a reduction in the collector loss. This means less voltage variation between the collector and emitter of the third transistor (output transistor) and thus output pulses of substantially constant amplitude are obtained.

These advantages are particularly useful for application in a plasma display device since it requires a large pulse current of short duration.

What is claimed is:

1. A pulse amplifier for producing sharp pulses of high amplitude, comprising, in combination, input and output terminals, a first transistor connected to said input terminal and arranged to change its on-off states in accordance with the presence and absence of input pulses applied to said input terminal, a second transistor having its base connected to the collector of said first transistor, a third transistor having its base connected to the emitter of said second transistor and having its collector connected in common with the collector of said second transistor to a power supply and having its emitter connected to said output terminal, so that said second and third transistors change their on-off states in alternate relationship with said first transistor, first circuit means connecting the base of said third transistor to the base of said second transistor for applying the potential at the base of said second transistor instantaneously to the base of said third transistor, and second circuit means connecting the output terminal to the collector of said first transistor to receive current from an external circuitry when said second transistor is non-conducting.

2. A pulse amplifier as claimed in claim 1, wherein said first circuit means includes a first diode having its anode connected to the emitter of said second transistor and said second circuit means includes a second diode having its anode connected to said output terminal.

3. A pulse amplifier as claimed in claim 2, wherein said first and second diodes are connected in series circuit relationship between said output terminal and the base of said second transistor.

4. A pulse amplifier as claimed in claim 2, wherein said first and second diodes are connected in parallel circuit relationship between the base of said third transistor and said output terminal and the base of said second transistor, respectively.

5. A pulse amplifier as claimed in claim 1, wherein each of said second and third transistor has a base of one conductivity type, and wherein said first circuit means includes a transistor having a base of the opposite conductivity type and having its emitter connected to the emitter of said second transistor and its base connected to the base of said second transistor, and said second circuit means includes a diode connected across said output terminal and the collector of said first transistor.

6. An amplifier as claimed in claim 1, wherein each of said second and third transistors has a base of one conductivity type, and wherein said second circuit means includes a transistor having a base of the opposite conductivity type and having the emitter connected to the emitter of said third transistor at its base connected to the base of said second transistor, and said first circuit means includes a diode connected across the emitter and base of said second transistor.

7. An amplifier as claimed in claim 1, wherein each of said second and third transistors has a base of one conductivity type, and wherein said first and second circuit means include respectively a fourth and a fifth transistor having a base of the opposite conductivity type and having their emitters connected to the emitter of said second and third transistors, respectively.

8. An amplifier as claimed in claim 7, wherein said fourth and fifth transistors have their base electrodes connected in common to the base electrode of said second transistor.

9. An amplifier as claimed in claim 7, wherein said fourth and fifth transistors have their base electrodes connected to the base of said second and third transistors, respectively.

10. A pulse amplifier for producing sharp pulses of high amplitude comprising input, output, power supply and reference terminals, a first transistor having its emitter-collector circuit connected between said supply and reference terminals and its base connected to said input terminal, said first transistor being operative between on-off states in response to the presence and absence of input pulses at said input terminal, output switching circuit means connected between said supply and output terminals, said switching circuit means being connected to said emitter-collector circuit and operative between non-conductive and conductive states in response to conductive and non-conductive states of said first transistor, respectively, said switching circuit means including a second transistor having its base connected to the collector of said first transistor, a third transistor having its base connected to the emitter of said second transistor and having its collector connected in common with the collector of said second transistor to said supply terminal and having its emitter connected to said output terminal, unidirectionally conductive circuit means connected between the base of said third transistor and the base of said second transistor for instantaneously applying the potential at the base of said second transistor to the base of said third transistor to thereby render said third transistor instantaneously non-conductive in response to a non-conductive state of said second transistor.

11. The pulse amplifier as claimed in claim 10 further including second circuit means for connecting said output terminal to the collector of said first transistor to receive current from an external circuitry, a diode pair connected electrically in series between a source of bias potential and said output terminal to pass current thereinto when said third transistor is non-conductive, one of said diodes being a charge storage diode, the charge on said charge storage diode being rapidly discharged when said third transistor is conductive to thereby generate a high current pulse at the junction of said diode pair in response to said input pulses.

* * * * *